United States Patent [19]
Kaldenberg

[11] Patent Number: 5,863,810
[45] Date of Patent: *Jan. 26, 1999

[54] METHOD FOR ENCAPSULATING AN INTEGRATED CIRCUIT HAVING A WINDOW

[75] Inventor: Peter Jacobus Kaldenberg, Nijmegen, Netherlands

[73] Assignee: Euratec B.V., Nijmegen, Netherlands

[ * ] Notice: This patent issued on a continued prosecution application filed under 37 CFR 1.53(d), and is subject to the twenty year patent term provisions of 35 U.S.C. 154(a)(2).

[21] Appl. No.: 434,909

[22] Filed: May 3, 1995

[30] Foreign Application Priority Data

May 9, 1994 [NL] Netherlands ............................ 9400766

[51] Int. Cl.[6] .............................. H01L 21/56; H01L 21/58
[52] U.S. Cl. .......................... 438/27; 438/116; 438/117; 438/124; 438/126; 438/127
[58] Field of Search .................................. 437/211, 217, 437/220; 257/434, 680, 98, 100, 681, 790; 438/116, 124, 126, 127, 117, 27

[56] References Cited

U.S. PATENT DOCUMENTS

| | | | |
|---|---|---|---|
| 3,778,685 | 12/1973 | Kennedy ................................ | 257/790 |
| 4,649,418 | 3/1987 | Uden ....................................... | 257/680 |
| 4,881,885 | 11/1989 | Kovac et al. ........................... | 425/121 |
| 4,942,140 | 7/1990 | Ootsuki et al. ........................ | 438/124 |
| 5,036,024 | 7/1991 | Mine et al. ............................. | 438/124 |
| 5,045,918 | 9/1991 | Cagan et al. ............................ | 257/747 |
| 5,057,457 | 10/1991 | Miyahara et al. ...................... | 438/25 |
| 5,200,367 | 4/1993 | Ko .......................................... | 437/216 |
| 5,331,205 | 7/1994 | Primeaux ............................... | 257/790 |
| 5,379,186 | 1/1995 | Gold et al. .............................. | 257/790 |
| 5,534,725 | 7/1996 | Hur ........................................ | 257/434 |
| 5,585,600 | 12/1996 | Froebel et al. ......................... | 174/52.4 |

FOREIGN PATENT DOCUMENTS

| | | | |
|---|---|---|---|
| 0 400 176 | 12/1990 | European Pat. Off. . | |
| 143839 | 9/1980 | Germany .............................. | 257/434 |
| 58-106851 | 6/1983 | Japan .................................... | 257/680 |
| 60-193 345 | 10/1985 | Japan . | |
| 60-193364 | 10/1985 | Japan .................................... | 257/680 |
| 61-036 957 | 2/1986 | Japan . | |
| 62-265 771 | 11/1987 | Japan . | |
| 63-60561 | 3/1988 | Japan .................................... | 257/434 |
| 63-078 557 | 4/1988 | Japan . | |
| 63-213373 | 9/1988 | Japan .................................... | 257/434 |
| 1-215068 | 8/1989 | Japan .................................... | 257/434 |
| 2-229453 | 9/1990 | Japan .................................... | 257/434 |
| 3-11757 | 1/1991 | Japan .................................... | 257/434 |

*Primary Examiner*—David Graybill
*Attorney, Agent, or Firm*—Young & Thompson

[57] ABSTRACT

A method for encapsulating an integrated semiconductor circuit. The semiconductor circuit is mounted onto the support surface of a so-called lead frame. Connecting wires are attached between the contact pads of the semiconductor circuit and selected parts of the lead frame. A predetermined volume of radiation-transparent plastic is supplied at a side of the semiconductor circuit opposite the side which is attached to the supporting surface, which plastic has a glass temperature lower than the temperature which is used for carrying out step c). A plastic package is produced by means of a mould, which package surrounds at least the semiconductor circuit, the supporting surface, the connecting wires and part of the lead frame.

1 Claim, 4 Drawing Sheets

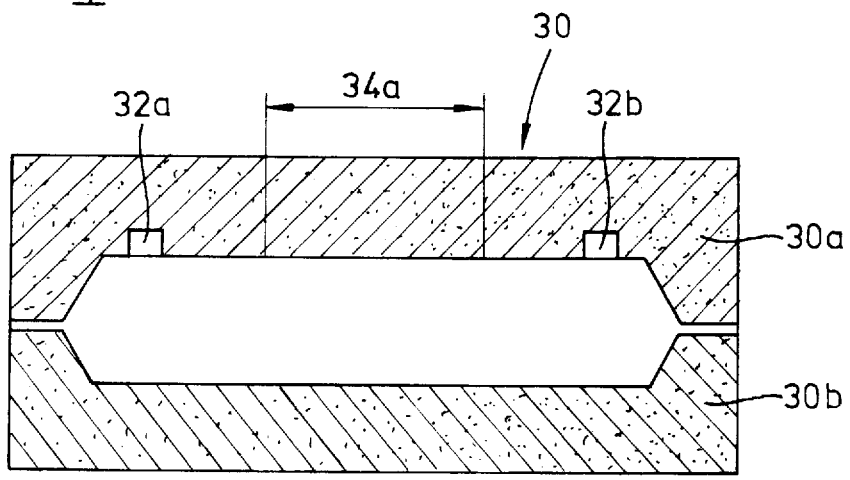
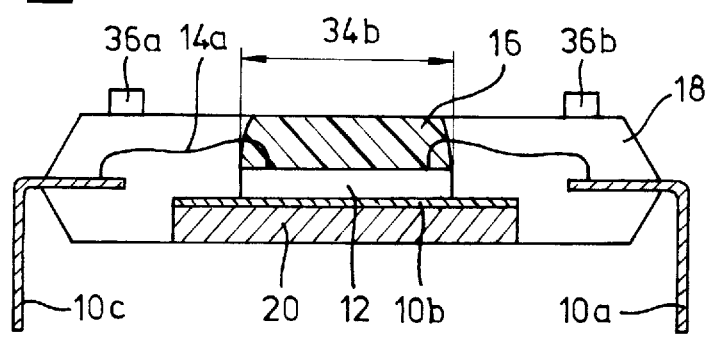
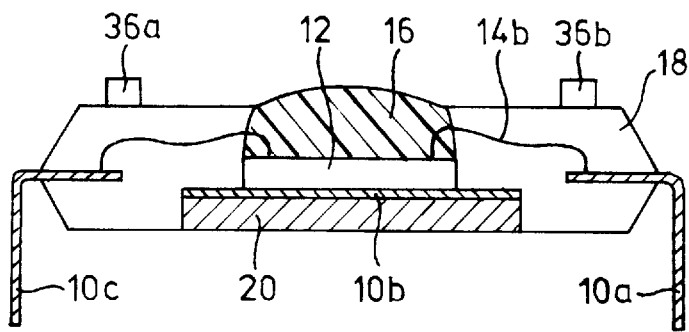

METHOD FOR ENCAPSULATING AN INTEGRATED CIRCUIT HAVING A WINDOW

FIELD OF THE INVENTION

The invention relates to a method for encapsulating an integrated semiconductor circuit (die) comprising the following eps:
 a) mounting the semiconductor circuit onto the supporting surface of a so-called lead frame,
 b) attaching connecting wires between the contact pads of the semiconductor circuit and selected parts of the lead frame (bonding),
 c) producing a plastic package by means of a mould, which package surrounds at least the semiconductor circuit, the supporting surface, the connecting wires and part of the lead frame.

The invention is specifically directed to a method for obtaining an encapsulation around an integrated circuit comprising opto-electronic components whereby the encapsulation has to contain a radiation transparent window. The term radiation covers in a broad sense both radiation in the visible part of the spectrum and also radiation in the infrared or ultraviolet part of the spectrum.

BACKGROUND OF THE INVENTION

In the U.S. Pat. No. 5,200,367 on the one hand a description is provided of so-called ceramic enclosures and on the other hand a description is provided of a plastic encapsulation which can be used as a replacement for a ceramic enclosure. In both cases the enclosure is embodied such that the integrated circuit at the side, where the radiation should impinge on the circuit, is open. This open side can be covered thereafter by a separate glass platelet, or, in case the integrated circuit does not comprise any light sensitive components, can be covered by a platelet of another material, such as a metal platelet.

It is considered well known that the use of ceramic enclosures will result into an increase of costs of the ultimate electronic component. Ceramic enclosures are therefore almost exclusively used for components which have to fulfil high requirements. Furthermore the use of a separate glass covering platelet has a number of disadvantages. A special glue or adhesive is necessary to attach the platelet to the respective section of the enclosure. Furthermore it is not possible, without taking further measures, to restrict the incidence of light to a window which is located at a predetermined positioned above the integrated circuit. A further disadvantage remains in the fact that changing temperatures may lead to stress which may cause loosening or burst of the glass platelet or may cause bursting or other damage to the enclosure.

A method whereby instead of a glass cover platelet use is made of a transparent plastic which is moulded into the open space and which fills this space completely, is for instance described in the European patent application EP-0,400,176. The disadvantage of this method is that no use is made of standard (open tooling) basic elements, so that the costs of this method are relatively high.

Additional methods are known, for instance from the Japanese patent application JP60193345, whereby first of all a layer of transparent plastic is deposited onto the semiconductor circuit using a separate mould, which layer after hardening forms the future light window. Thereafter the upper side of this light window is provided with a protection layer and the resulting half finished product is encapsulated using another mould such that the complete enclosure is obtained. Finally the protecting layer is removed from the window. This method has the disadvantage that the method as such has a large number of steps, whereby furthermore two different moulds are necessary to obtain the final result.

SUMMARY OF THE INVENTION

The object of the invention is now to indicate in which way, using a standard mould and using usual, so-called "open tooling" lead frame, an integrated circuit can be provided within an encap-sulation containing a window.

According to the invention the object is fulfilled with a method as described in the first paragraph, in that between the steps b) and c) the following additional step is carried out:
 d) supplying a predetermined volume of radiation transparent plastic at that side of the semiconductor circuit opposite the side which is attached to the supporting surface, which plastic has a glass temperature lower than the temperature which is used for carrying out step c).

BRIEF DESCRIPTION OF THE DRAWINGS

The invention will be explained in more detail with reference to the attached drawings.

FIG. 4 illustrates a cross section through a mould preferably used within the scope of the invention.

FIG. 5 illustrates a cross section through an enclosure, made with the mould illustrated in FIG. 4.

FIG. 6 illustrates a cross section through a differently embodied enclosure.

DESCRIPTION OF THE PREFERRED EMBODIMENTS

Figure 1A:
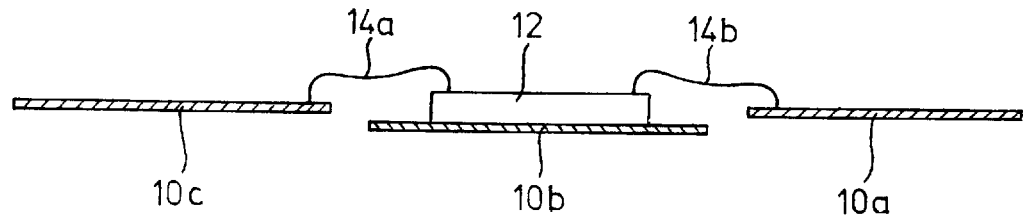
FIG. 1 illustrates in a number of views 1A . . . 1D a number of stages during the application of the method according to the invention.

In the FIGS. 1A . . . 1D various successive stages during the application of the method according to the invention are indicated.

During the fabrication of integrated semiconductor circuits in general a large number of these circuits are manufactured simultaneously onto one single large flat silicon plate, a so-called wafer. After completing the integration process the wafer is subdivided into the separate semiconductor circuits or chips using known techniques, such as cutting or etching. (In English literature the terms die"or " pellet are also used instead of chip.) Each chip is thereafter positioned onto a metal framework comprising a number of contact pins which are mutually connected by means of interconnecting sections such that as a whole a so-called lead frame is formed. The central section (paddle or stem) of such a lead frame comprises a supporting surface onto which the chip can be located and fixed by means of soldering or in another manner, known as such. After fastening the chip in this manner to the central section of the lead frame the bonding wires are attached between the various contact pins and the connecting surfaces or "pads" on the chip. The result after completing this step is schematically illustrated in cross section in FIG. 1A.

In FIG. 1A the parts of the lead frame are indicated with 10a, 10b and 10c. The contact pins are formed by the parts 10a and 10c, whereas the central mounting surface of the lead frame is indicated by 10b. Onto this mounting surface 10b (in English called "die pad") the chip 12 is fastened in a known manner, which does not play a role within the scope of the invention. Furthermore, in between the connecting pins 10a and 10c on the one hand and the chip 12 on the other hand, bonding wires 14a and 14b are installed. All these techniques are known as such and do not require any further explanation.

Figure 1B:
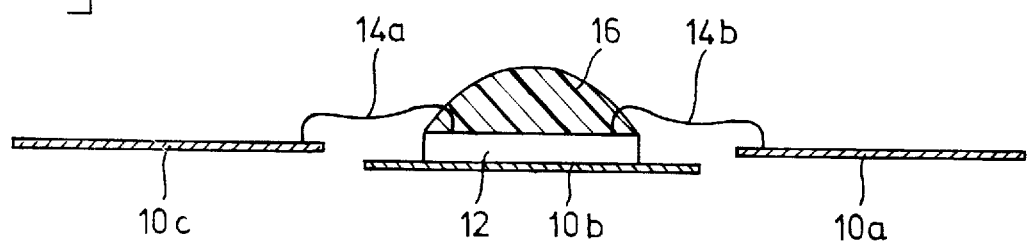

The next step in the method is illustrated in FIG. 1B. In this step dosing means, known per se, are used to deposit a small amount of a suitable transparent resin 16 onto the upper surface of the chip 12. The consistency of the resin 16 is such that a somewhat spherical layer remains on the chip 12. After depositing the layer 16, this layer is at least partly hardened before the next step of the method is carried out.

Figure 1C:
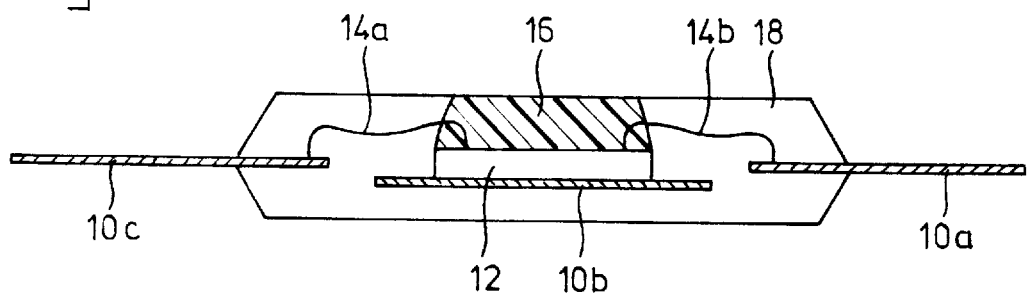

For carrying out the next method step the now obtained half finished product is positioned in a mould, which is known per se, for making an enclosure around the half finished product. The resin for manufacturing the enclosure is processed at a temperature which is higher than the glass temperature Tg of the transparent resin 16, so that at least during the moulding process said resin 16 will be softened to some degree. The result thereof is that the upper side of the layer 16 is pressed flat against the wall of the mould, whereas simultaneously the remaining free space in the mould is filled with the encapsulating resin 18. After at least partly hardening the now encapsulated semiconductor circuit and after removing the circuit from the mould the product is obtained which is in cross section illustrated in FIG. 1C. The degree of hardening of the resin 16 and also the volume of the resin both have influence on the diameter D of the ultimately obtained window (see FIG. 1D).

Figure 1D:
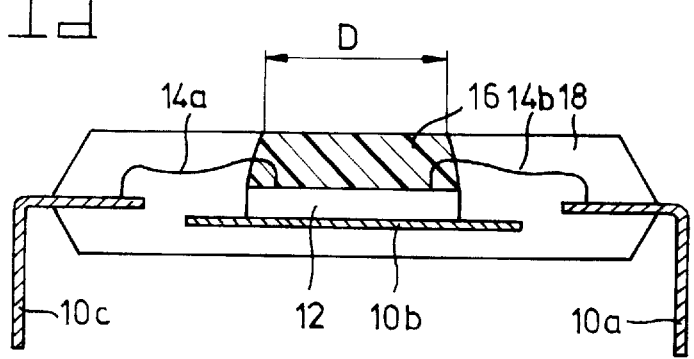

The next steps to obtain a usable end result are known as such. To start with the still present connecting parts between the separate contact pins 10a, 10c, etc., should be removed so that these pins in an electrical sense do not provide a short circuit and thereafter, or eventually simultaneously, these pins should be bent into the desired shape, for instance perpendicular downwards as illustrated in FIG. 1D.

For the quality of the ultimately realized window comprising enclosure (formed by the transparent section 16 of the enclosure) the resin, of which the section 16 is formed, has to fulfil a number of requirements:
1) The resin should be highly transparent to the radiation, which has to pass the window 16, which radiation may be in the visible part of the spectrum but also in the ultraviolet or infrared part of the spectrum.
2) The resin should have a glass temperature Tg below the temperature at which the resin 18 is processed in the mould, so that because of the weakening of the transparent resin as result thereof, this resin can adapt the ultimately desired shape during the moulding process.

To obtain a window with the same optical path length over the whole surface of the chip the upper surface of the chip 12 and the upper surface of the window 16 should be essentially parallel. Therefore, the quality of the final product is also determined by the extent to which the upper surface of the chip 12 runs parallel to the upper surface of the window 16. In other words, the manner in which the height of the window 16 above the chip 12 is constant. In this relation it is in agreement with the invention proposed to obtain a fixation of the chip 12 especially during the application of the encapsulating resin 18, by attaching a distance element 12 underneath the mounting surface 10b before carrying out this step. The use of this distance element is illustrated in detail in FIG. 2.

Figure 2A:
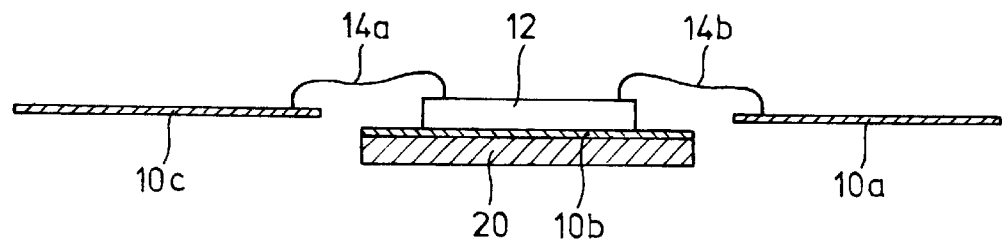
FIG. 2 illustrates in a number of views 2A . . . 2D a number of stages during the application of the procedure according to the invention in case an additional distance element is applied.

In the FIGS. 2A . . . 2D is, in the same manner as in FIG. 1, a series of situations illustrated which arise during the method according to the invention, whereby use is made of a separate distance element 20. The situation in FIG. 2A is in fact comparable with the situation in figure 1a to the difference that now a distance element 20 is attached to the underside of the mounting plate 10b using techniques which are known as such, such as soldering, gluing, etc.

Figure 2B:
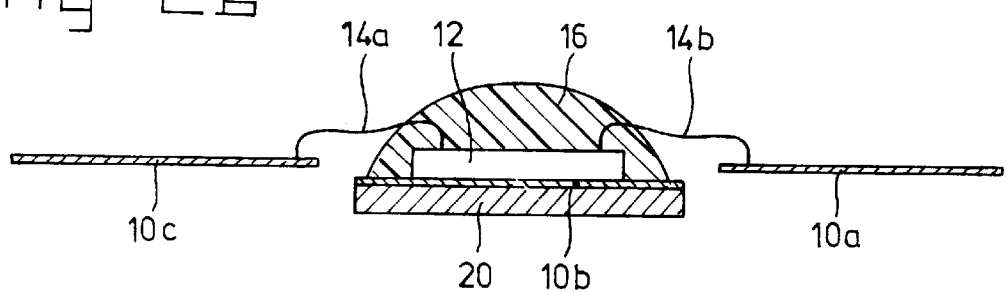
Figure 2C:
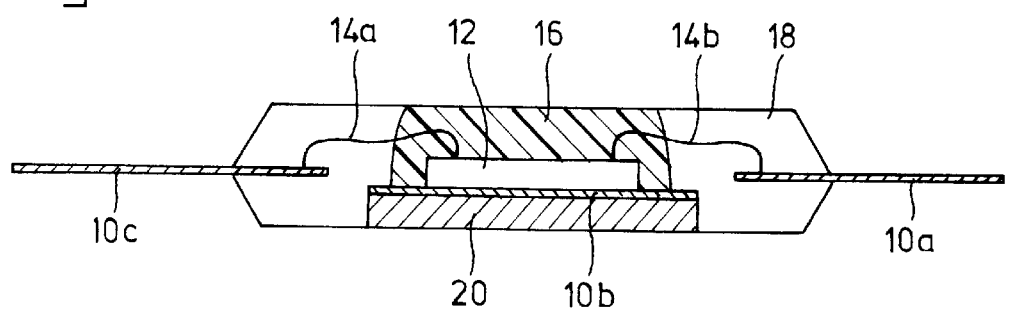
Figure 2D:
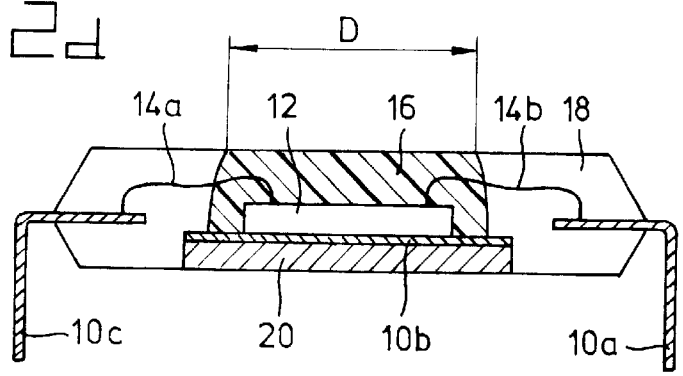

Thereafter a predetermined amount of transparent resin 16 is applied to the upper surface of the chip 12 and this transparent resin is partly hardened resulting into the semi-manufactured product, the cross section of which is illustrated in FIG. 2B. The amount of transparent resin 16, applied in FIG. 2B, is larger than the amount used in FIG. 1B with the result that not only the chip 12 but also at least a part of the mounting surface 10b is covered by the resin.

Thereafter this half finished product is inserted into a mould and the encapsulating resin 18 is transferred into the mould at a predetermined relatively high temperature. During this procedure pressure will be applied to the upper side of the mould (as seen in the situation according to FIG. 2C) in downwards direction onto the initial surplus of the transparent resin 16. As a result of the presence of the distance element 20, supported by the lower side of the mould, the chip will not undergo any displacement because of this pressure, on the contrary, the chip will be definitely secured in place. If it is assumed that the inner walls of the mould 20 are extending parallel and that the distance element 20 has a uniform thickness, then the final result is an encapsulated chip whereby the upper surface of the chip 12 extends parallel to the upper surface of the encapsulation so that the window 16 has a uniform thickness. Because a larger amount of resin was applied, also the diameter D of the obtained window is larger than in FIG. 1D.

It will be clear that by selecting the suitable dimensions of the distance element 20, the thickness of the transparent resin 16 can be predetermined accurately. Because furthermore the conditions during the moulding process are well reproducible, it is possible to predetermine empirically the volume of transparent resin which should be applied onto the upper surface of the chip 12 to obtain the situation of FIG. 2B, and to obtain finally, after the reshaping process in the mould, a window with accurately determined dimensions.

Figure 3A:
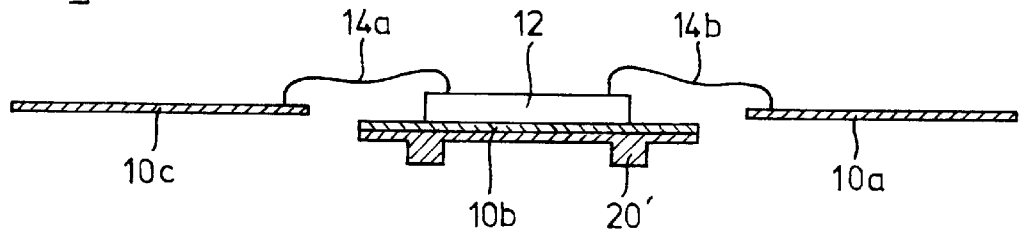
FIG. 3 illustrates in a number of views a similar method as illustrated n FIG. 2, however, in this case applying a differently shaped distance element.

In the FIGS. 3A . . . 3D again, in the same manner as in FIGS. 1 and 2, a series of situations are illustrated which will arise in the course of a method according to the invention, whereby now the used distance element 20' is shaped somewhat differently. As appears from the various figures the distance element 20' is embodied as a relatively thin flat plate with a number of legs or ribs which form the actual distance determining parts. The result of using such a distance element 20' is that almost the whole distance element is embedded in the encapsulating resin. Therewith a tight connection between the resin and the distance element 20' is obtained.

Figure 3B:
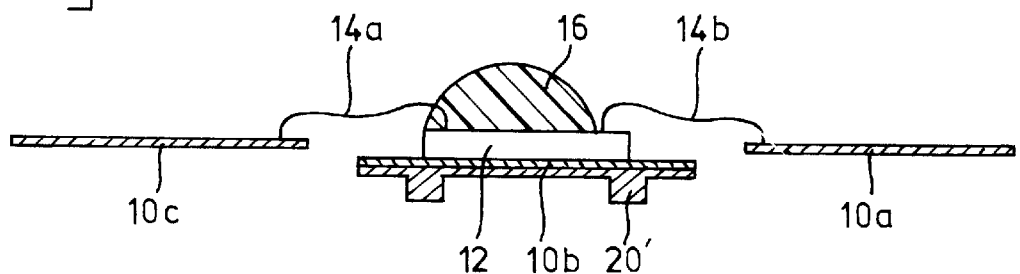
Figure 3C:
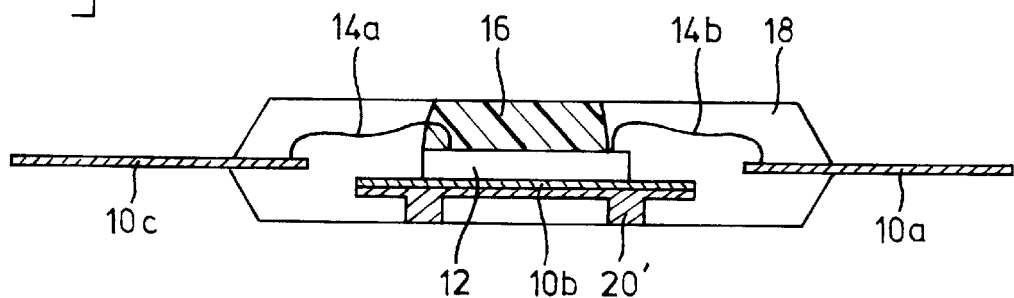
Figure 3D:
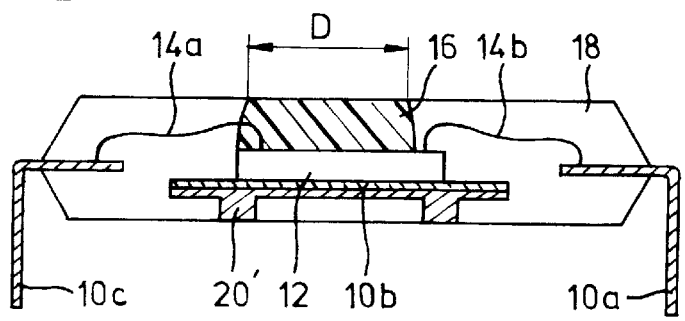

To illustrate the flexibility of the method even further in FIGS. 3B a relatively small amount of resin is applied, so that only part of the surface of the chip 20 is covered. It will be clear that in the end result, illustrated in FIG. 3D, the diameter of the window D will be smaller than that of the windows illustrated in FIGS. 1D and 2D.

According to the invention it is preferred to manufacture the distance element 20 out of a heat conducting material, which has preferably the same expansion coefficient as the encapsulating resin 18.

A distance element made of metal such as brass, has the additional advantage that therewith a screening function can be obtained.

The upper surface of the window 16 at the outside of the encapsulation should preferably be as smooth as possible to obtain less or no dispersion of the impinging light. A high degree of smoothness can be obtained by locally finishing the inner wall of the mould 30.

FIG. 4 illustrates a cross section through a mould 30, comprising the lower half 30*b* and the upper half 30*a*. Part of the inner wall of the upper section 30*a*, roughly indicated by the distance indication 34*a*, will during the manufacturing process come into contact with the transparent resin 16. If this respective section 34*a* is given a smooth finish, for instance by polishing or in another suitable manner, then also the products, made with such a mould, will obtain a smooth surface at the upper side of the window 16. Preferably the mould is finished such, that the upper side of the window 16 has a surface roughness Ra better than 0.2.

To protect the smooth surface of the window 16 as well as possible against external influences it is preferred to manufacture a number of extending parts to the upper side of the enclosure so that the chance on scratches or other damages of the surface of the window 16 is reduced. For that purpose the mould, as is illustrated in FIG. 4, comprises a number of excavations 32*a*, 32*b*, . . . , taking care that the finished product, which is schematically illustrated in FIG. 5, comprises a number of outwardly extending parts 36*a*, 36*b*, . . . It is pointed out in FIG. 5 that the schematically indicated surface 34*b*, at least including the upper side of the window 16, has a very low roughness within the above indicated margins as result of the finishing of the section 34*a* of the inner wall of the mould 30.

FIG. 6 illustrates a further embodiment of an enclosure which can be manufactured using the method according to the invention. The difference between FIG. 1D and FIG. 6 is recognized in the fact that the upper surface of the window 17 has a concave shape, providing a functional lens and resulting into more or less focusing the impinging radiation onto a predetermined section of the chip 12. It will be clear, also without further illustration, that the inner wall of the upper section 30*a* of the mould 30 should comprise a convex excavation shaped in such a manner, that therewith the desired concave bulge of the window 16 can be obtained.

If desired, also the inverted situation is possible, whereby as a result a convex shaped surface of the window 16 can be realizes.

It will be clear that the mould can be shaped such that only a part of the window has a concave or convex surface whereas the remaining section is flat.

Suitable resins for manufacturing the window 16 are commercially available. As an example the attention is drawn to the product Amicon Me 45 W, a crystal-clear two-component resin hardening at room temperature. This resin is amongst others supplied by the firm Grace in Westerlo. Another resin is Hysol EPR 250-1, an optically crystal-clear epoxy resin transmitting radiation even into the ultraviolet part of the spectrum. This resin, which is supplied by The Dexter Corporation, California, U.S.A., is especially suited in case the chip for instance has to be programmed by means of UV-radiation, such as is done with some types of EPROMs.

Although in the various figures the finally obtained component (see FIGS. 1D, 2D, 3D, 5, and 6) is destined for pin hole mounting, it will be clear that with another finishing of the extending lead pins also so-called SMD-components, components which are suited for surface mounting, can be obtained.

What is claimed is:

1. A method for encapsulating an integrated semiconductor circuit, comprising the following sequential steps:

a) mounting the semiconductor circuit on a supporting surface of a lead frame;

b) attaching connecting wires between contact pads of the semiconductor circuit and the lead frame;

c) depositing a volume of radiation-transparent fluid resin on the semiconductor circuit, the resin having a lower glass transition temperature than a temperature to be used in step e), the resin having a consistency during said depositing step such that a substantially spherical layer of resin remains on the semiconductor circuit;

d) partially hardening the spherical layer of resin;

e) molding a plastic package to surround at least the semiconductor circuit, the supporting surface, the connecting wires and part of the lead frame, thereby encapsulating said semiconductor circuit, such that at least part of the radiation-transparent layer is not covered by said plastic package and forms a radiation transparent window to the semiconductor circuit.

* * * * *